(12) United States Patent
Lee

(10) Patent No.: US 6,759,180 B2
(45) Date of Patent: Jul. 6, 2004

(54) METHOD OF FABRICATING SUB-LITHOGRAPHIC SIZED LINE AND SPACE PATTERNS FOR NANO-IMPRINTING LITHOGRAPHY

(75) Inventor: Heon Lee, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 103 days.

(21) Appl. No.: 10/133,772

(22) Filed: Apr. 23, 2002

(65) Prior Publication Data

US 2003/0203319 A1 Oct. 30, 2003

(51) Int. Cl.⁷ .................................................. G03F 7/26

(52) U.S. Cl. ...................................... 430/313; 430/311

(58) Field of Search .............................. 430/311, 313, 430/314, 315, 317

(56) References Cited

U.S. PATENT DOCUMENTS 6,559,501 B2 * 5/2003 Sung et al. ................. 257/316

\* cited by examiner

*Primary Examiner*—Kathleen Duda
(74) *Attorney, Agent, or Firm*—Trueman H. Denny

(57) ABSTRACT

A method for fabricating sub-lithographic sized line and space features is disclosed. The method includes the use of conventional microelectronics processing techniques such as photolithographic patterning and etching, polysilicon deposition, polysilicon oxidation, polysilicon oxide etching, polysilicon wet and plasma etching, and chemical mechanical planarization. Polysilicon line features having a feature size that is greater than or equal to a lithography limit are oxidized in a plasma that includes an oxygen gas. The oxidation forms a sub-lithographic sized polysilicon core and an oxidized polysilicon mantel that includes portions along sidewall surfaces of the sub-lithographic sized polysilicon core that also have a sub-lithographic feature size. After planarization and a plasma etch that is selective to either the polysilicon or the oxidized polysilicon, a plurality of sub-lithographic sized line and space patterns are formed. Those line and space patterns can be used for an imprinting stamp for nano-imprint lithography.

13 Claims, 5 Drawing Sheets

METHOD OF FABRICATING SUB-LITHOGRAPHIC SIZED LINE AND SPACE PATTERNS FOR NANO-IMPRINTING LITHOGRAPHY

FIELD OF THE INVENTION

The present invention relates generally to a method of fabricating sub-lithographic sized line and space patterns. More specifically, the present invention relates to a method of fabricating sub-lithographic sized line and space patterns on various substrates using a combination of conventional microelectronics processes including photolithographic patterning and etching, polysilicon etching, polysilicon oxidation, and polysilicon deposition.

BACKGROUND OF THE INVENTION

Nano-imprinting lithography is a promising technique for obtaining nano-size patterns (as small as a few tens of nanometers). A key step in forming the nano-size patterns is to first form an imprinting stamp that includes a pattern that complements the nano-sized patterns. Typically, the imprinting stamp includes sub-lithographic sized line and space patterns that are carried by a substrate material. The imprinting stamp is urged into contact with another substrate that includes a mask layer. The mask layer can be a polymer such as a photoresist material, for example. The sub-lithographic sized line and space patterns are transferred to the mask layer and are replicated therein. Typically, subsequent microelectronics processing steps are used to transfer the sub-lithographic patterns from the mask layer to an underlying layer positioned below the mask layer.

A standard method in the microelectronics industry for patterning features on a substrate uses well understood photolithographic processes. Typically, a layer of photoresist is coated onto a substrate material followed by exposing the photoresist with a light source through a mask. The mask includes patterned features, such as lines and spaces, that are to be transferred to the photoresist. After the photoresist is exposed, the photoresist is etched or is immersed in a solvent to define the patterns that were transferred to the photoresist. The patterns produced by this process are typically limited to line widths greater than a lithography limit $\lambda$ of a photolithographic alignment tool, which is ultimately limited by a wavelength of light of a light source used to expose the photoresist. At present, a state of the art photolithographic alignment tool is capable of printing line widths as small as $\lambda=100.0$ nm.

Features patterned into the photoresist are transferred into the substrate material using well known microelectronics processes such as ion milling, plasma etching, or chemical etching, for example. Using standard microelectronics processing methods, lines or spaces with a feature size (i.e. a width) greater than or equal to $\lambda$ or a grating (a line-space sequence) with a period greater than or equal to $2\lambda$ can be created.

However, in many applications it is advantageous to have features such as lines and spaces be as small as possible. Smaller line widths or periods translate into higher performance and/or higher density circuits. Hence, the microelectronics industry is on a continual quest to reduce the minimum resolution in photolithography systems and thereby reduce the line widths or periods on patterned substrates. The increases in performance and/or density can be of considerable economic advantage because the electronics industry is driven by a demand for faster and smaller electronic devices. The imprinting stamps used for nano-imprinting lithography are just one example of an application in which it is necessary to have line and space patterns that are as small as possible and that have a feature size that is less than the lithography limit $\lambda$.

Consequently, there exists a need for method of fabricating sub-lithographic sized line and space patterns that utilizes conventional microelectronics processes including conventional lithography systems to fabricate the sub-lithographic sized line and space patterns with a feature size that is less than the lithography limit $\lambda$ of the lithography system.

SUMMARY OF THE INVENTION

The method of fabricating sub-lithographic sized line and space patterns of the present invention address the need for fabricating sub-lithographic sized line and space patterns using conventional microelectronics processes.

A plurality of sub-lithographic line and space patterns that can be used for applications including but not limited to an imprinting stamp in a nano-imprinting lithography process, micro-electro-mechanical systems, and sub-lithographic optical systems can be fabricated using conventional microelectronics processes including photolithographic patterning and etching, polysilicon deposition, polysilicon oxidation, polysilicon oxide etching, polysilicon wet and plasma etching, and chemical mechanical planarization.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 3b is a cross-sectional view depicting in greater detail the formation of the sub-lithographic line feature of FIG. 3a.

FIG. 4 is a cross-sectional view depicting a polysilicon layer deposited over the sub-lithographic line and space features of FIG. 3a.

DETAILED DESCRIPTION

Figure 1A:
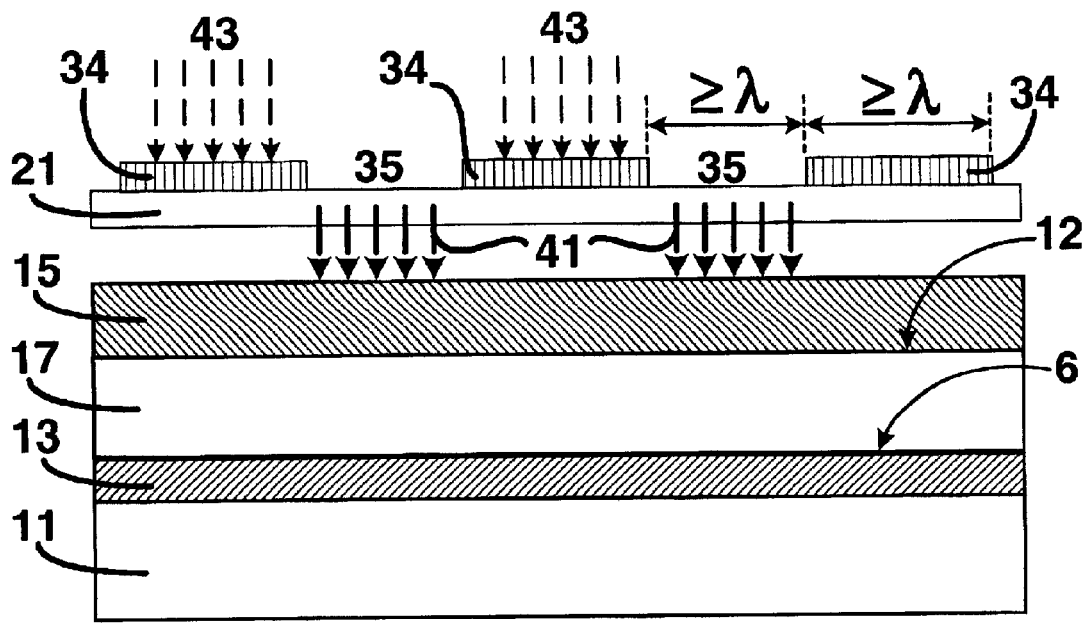
FIGS. 1a and 1b are cross-sectional views depicting photolithographic patterning and etch processes according to the present invention.

In the following detailed description and in the several figures of the drawings, like elements are identified with like reference numerals.

As shown in the drawings for purpose of illustration, the present invention is embodied in a method of fabricating sub-lithographic sized line and space patterns. The method includes depositing a first polysilicon layer on a surface of a base layer. followed by depositing a photoresist layer on the first polysilicon layer. The photoresist layer is patterned and then etched to define a line and space pattern with a minimum feature size that is greater than or equal to a lithography limit of a lithographic system used for the patterning. The line and space pattern is transferred to the first polysilicon layer by etching the first polysilicon layer to define a plurality of polysilicon line features and space features in the first polysilicon layer.

The polysilicon line features and the space features also include the minimum feature size that is greater than or equal to the lithography limit of the lithographic system used for the patterning. The photoresist layer is then removed and the polysilicon line features are oxidized in a plasma comprising an oxygen gas.

The oxidation of the polysilicon line features is continued until the polysilicon line features are reduced to a sub-lithographic feature size and an oxidized mantel of the polysilicon line features has expanded. The expansion results in the space features being reduced to a sub-lithographic feature size. Consequently, after the oxidation of the polysilicon line features, both the polysilicon line features and the space features have the sub-lithographic feature size.

A second polysilicon layer is deposited over the polysilicon line features and space features and completely covers the polysilicon line features and completely fills in the space features. The second polysilicon layer is planarized to form a planar layer of alternating and sub-lithographic sized polysilicon line features and oxidized polysilicon line features.

The planar layer is then etched to selectively remove either the polysilicon line features or the oxidized polysilicon line features. After the selective etch, the base layer comprises a plurality of sub-lithographic sized polysilicon line features and sub-lithographic sized space features or a plurality of sub-lithographic sized oxidized polysilicon line features and sub-lithographic sized space features.

In FIG. 1a, method of fabricating sub-lithographic sized line and space patterns includes depositing a first polysilicon layer 17 (α-Si) on a surface 6 of a base layer 13. The base layer 13 can be made from a variety of materials including but not limited to a dielectric material. For example, suitable materials for the base layer 13 include but are not limited to silicon oxide ($SiO_2$) and silicon nitride ($Si_3N_4$). A process including but not limited to sputtering and chemical vapor deposition (CVD) can be used to deposit the first polysilicon layer 17.

Optionally, the base layer 13 can be connected with a substrate 11. The substrate 11 can be a semiconductor material. For instance, the substrate 11 can be silicon (Si), such as a wafer of single crystal silicon. If the substrate is silicon, then the base layer 13 can be formed by depositing or growing a layer of silicon oxide ($SiO_2$) on a surface of the silicon.

A photoresist layer 15 is deposited on a surface 12 of the first polysilicon layer 17. The photoresist layer 15 is then patterned by a lithographic system (not shown). For example, a deep UV photolithographic system can be used to pattern the photoresist layer 15. Light (41, 43) from a light source (not shown) illuminates a mask 21 carrying a pattern formed by a line feature 34 that is opaque to the light and a space feature 35 that is optically transparent to the light. The light 41 passes through the mask 21 and causes a photo active reaction in those portions of the photoresist layer 15 that the light 41 is incident on. Conversely, the light 43 is blocked by the line feature 34. As a result, the photoresist layer 15 is exposed with an image of the pattern (34, 35). The line features 34 and the space features 35 have a minimum feature size that is greater than or equal to a lithography limit $\lambda$ (i.e. $\geq \lambda$) of a lithographic system used for the patterning.

Figure 1B:
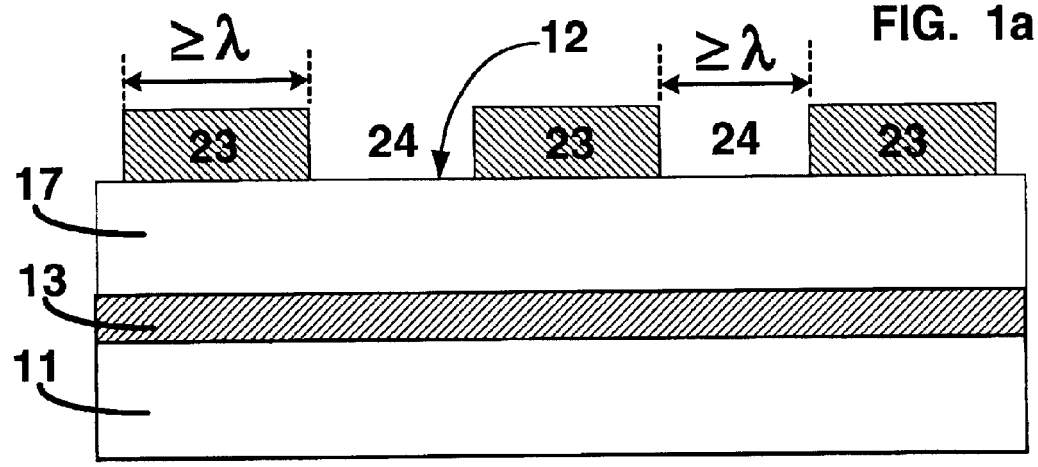

In FIG. 1b, the photoresist layer 15 is then etched to define a line 23 and space 24 pattern therein. The line and space pattern (23, 24) also have a minimum feature size that is greater than or equal to the lithography limit $\lambda$ (i.e. $\geq \lambda$). Etching of the photoresist layer 15 can be accomplished by a process including but not limited to wet etching, plasma etching, and developing the photoresist layer 15 in a solvent.

Figure 2:
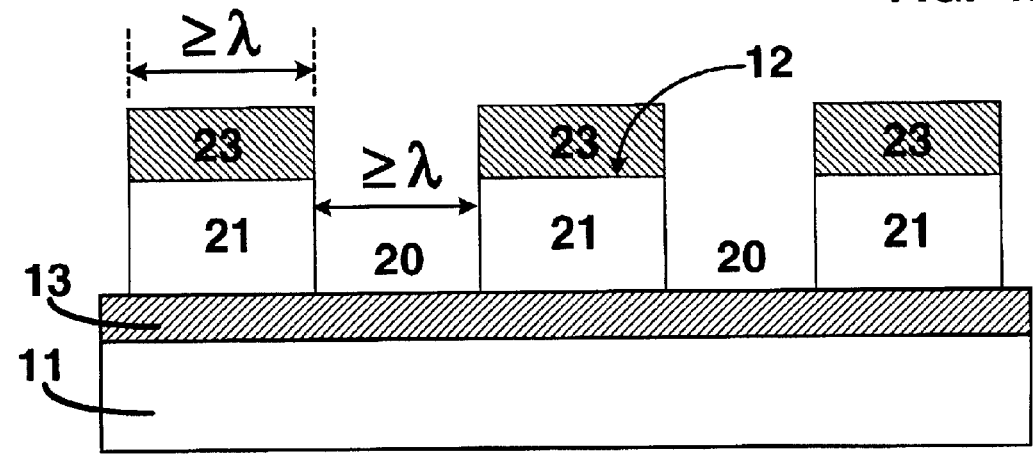
FIG. 2 is a cross-sectional view of a line and space pattern with a feature size greater than or equal to a lithography limit according to the present invention.

In FIG. 2, the line and space pattern (23, 24) is transferred to the first polysilicon layer 17 by etching the first polysilicon layer 17 to define a plurality of polysilicon line features 21 and space features 20. The line pattern 23 serves as an etch mask for an underlying layer of the first polysilicon layer 17. The polysilicon line features 21 and the space features 20 also include a minimum feature size that is that is greater than or equal to the lithography limit $\lambda$ (i.e. $\geq \lambda$) of the lithographic system used for the aforementioned patterning. A process including plasma etching and wet etching can be used to etch the first polysilicon layer 17.

Figure 3A:
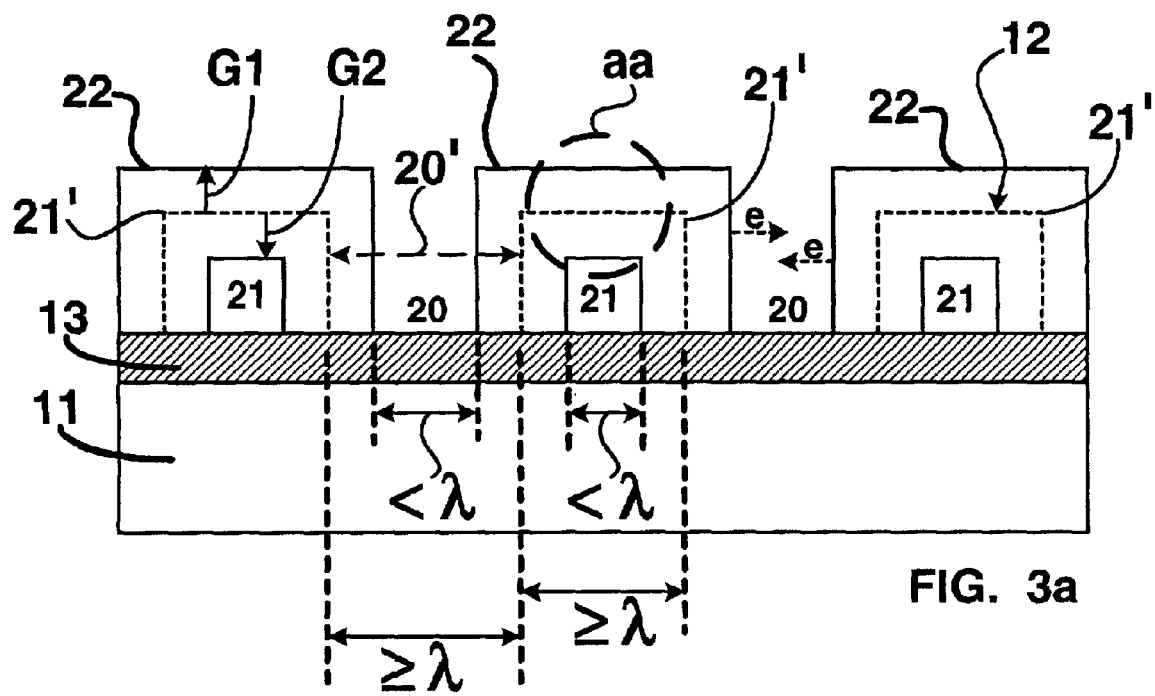
FIG. 3a is a cross-sectional view depicting formation of sub-lithographic line and space features by polysilicon oxidation according to the present invention.

In FIG. 3a, the photoresist layer (i.e. the line pattern 23) is removed from the polysilicon line features 21. A process including but not limited to a wet etch process, a wet cleaning process using an organic solvent, and an ashing process in a plasma comprising an oxygen gas ($O_2$) can be used to remove the photoresist layer 23.

The polysilicon line features 21 are then oxidized in a plasma comprising an oxygen gas ($O_2$). The oxygen gas oxidizes the polysilicon material of the polysilicon line features 21. The oxidation step continues until the polysilicon line features 21 are reduced G2 to a sub-lithographic feature size that is less than $\lambda$ (i.e. $<\lambda$) and an oxidized mantel 22 of the polysilicon line features 21 has expanded G1 thereby reducing the space features 20 to the sub-lithographic feature size because as the oxidized mantel 22 expands as shown by arrows e, the space features 20 are reduced in width.

As a result of the oxidation process, an initial dimension 21' of the polysilicon line features 21 that was greater than or equal to $\lambda$ (i.e $\geq \lambda$) is reduced to a final dimension 21 that has the sub-lithographic feature size that is less than $\lambda$ (i.e. $<\lambda$).

Similarly, the expansion e results in an initial width 20' of the space features 20 that is $\geq \lambda$ to be reduced to a final width 20 that has the sub-lithographic feature size that is less than $\lambda$ (i.e. $<\lambda$).

Figure 3B:
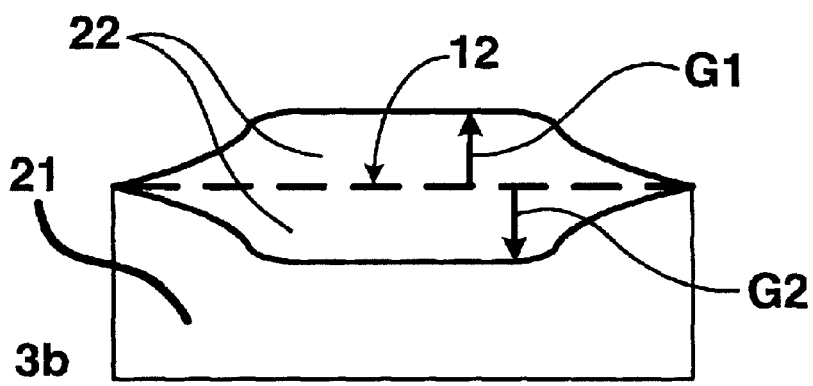

In FIG. 3b, a circular section aa of FIG. 3a depicts in greater detail the formation of the oxidized mantel 22 resulting from the reduction of the polysilicon line features 21 and the expansion of the space features 20 during the oxidation in the plasma comprising the oxygen gas ($O_2$). As the oxidation proceeds, a portion of the polysilicon line features 21 is converted into oxidized polysilicon; therefore, in a plane below the initial surface 12 as shown by arrow G2, the dimensions of the polysilicon line features 21 are reduced. That reduction in dimensions continues until the polysilicon line features 21 have the sub-lithographic feature size that is less than λ.

In contrast, as the oxidation proceeds, a portion of the polysilicon line features 21 expands above the initial surface 12 as shown by arrow G1 as that portion is converted into oxidized polysilicon. Consequently, the initial width 20' of the space features 20 that was greater than or equal to λ is reduced to a width that is less than λ such that the space features 20 also have the sub-lithographic feature size.

Figure 3C:
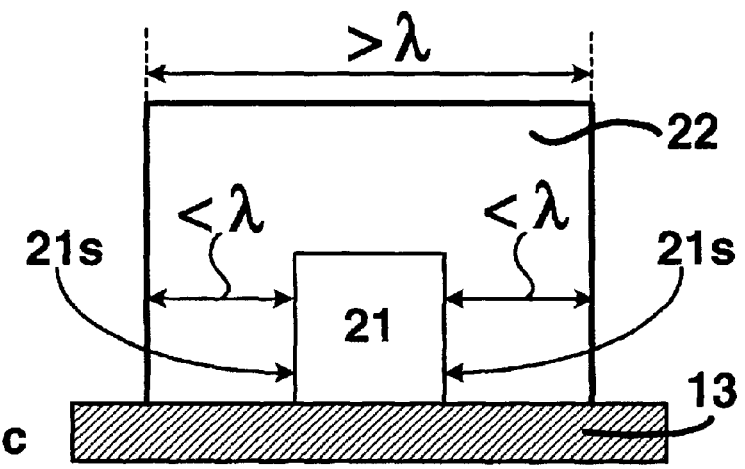
FIG. 3c is a cross-sectional view depicting various dimensional relationships between an oxidized mantel and a lithography limit according to the present invention.

Moreover, in FIG. 3c, after the oxidation step is completed, the oxidized mantel 22 has a width that is greater than λ. (i.e. >λ) However, those portion of the oxidized mantel 22 adjacent to vertical sidewall surfaces 21s of the polysilicon line features 21 have a width that is less than λ (i.e. <λ).

Figure 4:
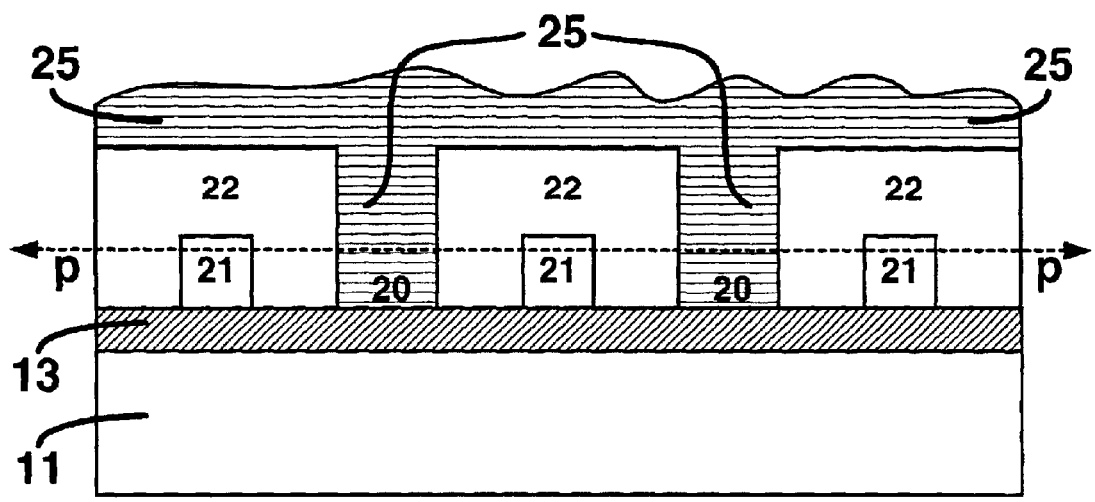

In FIG. 4, a second polysilicon layer 25 (α-Si) that completely covers the oxidized mantel 22 of the polysilicon line features 21 and completely fills in the space features 20 is deposited. A process including but not limited to plasma enhanced chemical vapor deposition (PECVD), chemical vapor deposition (CVD), and low pressure chemical vapor deposition (LPCVD) can be used to deposit the second polysilicon layer 25.

Figure 5:
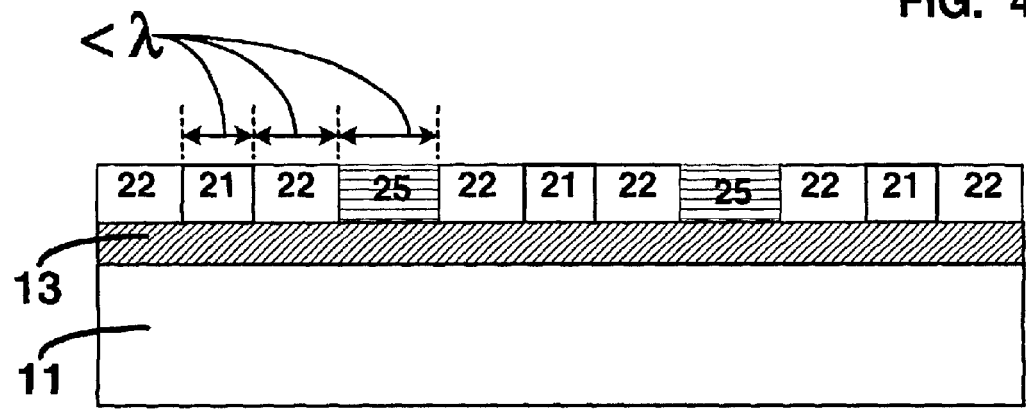
FIG. 5 is a cross-sectional view depicting a planarization process according to the present invention.

In FIG. 5, the second polysilicon layer 25 is planarized to form a planar layer of alternating and sub-lithographic sized polysilicon line features (21, 25) and oxidized polysilicon line features 22. The second polysilicon layer 25 is planarized along a predetermined plane (see dashed line and reference numeral p in FIG. 4).

The oxidized polysilicon line features 22, are depicted in FIG. 3c and are those portions of the oxidized mantle 22 that are adjacent to the vertical sidewall surfaces 21s of the polysilicon line features 21. The polysilicon line features (21, 25) and the oxidized polysilicon line features 22 all have the sub-lithographic feature size that is less than λ. A process such as chemical mechanical planarization (CMP) can be used to planarize the second polysilicon layer 25, for example.

The planar layer is then etched to selectively remove either the polysilicon line features (21, 25) or the oxidized polysilicon line features 22. An etching process including but not limited to a wet etch process and a plasma etching process can be used to selectively etch the polysilicon line features (21, 25) or the oxidized polysilicon line features 22. Preferably, a wet etch process is used to etch the oxidized polysilicon line features 22 and a wet etch or plasma etch process is used to etch the polysilicon line features (21, 25). More preferably, the plasma etch process for the polysilicon line features (21, 25) should be a process other than a reactive ion etching (RIE) process.

Figure 6:
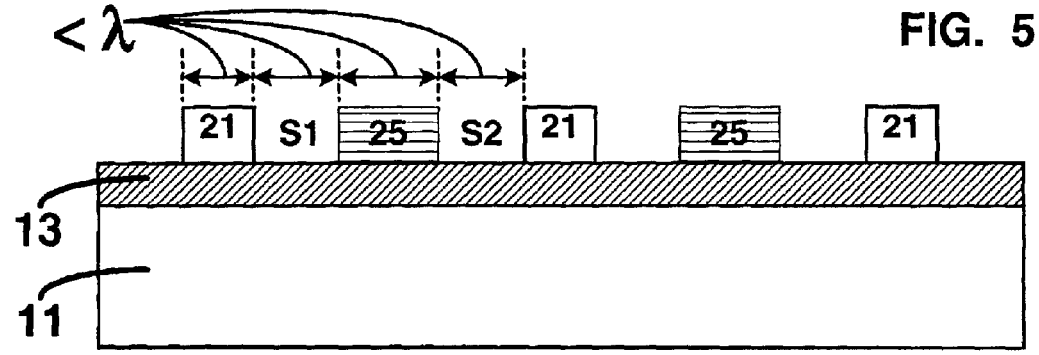
FIGS. 6 and 7 are cross-sectional views depicting a selective etching process according to the present invention.

For instance, a wet etch process that is selective to polysilicon (i.e. the etchant removes the oxidized polysilicon) can be used to selectively remove the oxidized polysilicon line features 22 as depicted in FIG. 6, wherein after the selective etch, the polysilicon line features (21, 25) remain on the base layer 13. As a result, a sub-lithographic line and space pattern with the polysilicon line features (21, 25) that have the sub-lithographic size that is less than λ and spaces (S1, S2) that also have the sub-lithographic size that is less than λ are defined on the base layer 13. The spaces (S1, S2) are created when the oxidized polysilicon line features 22 are removed by the etching process.

Figure 7:
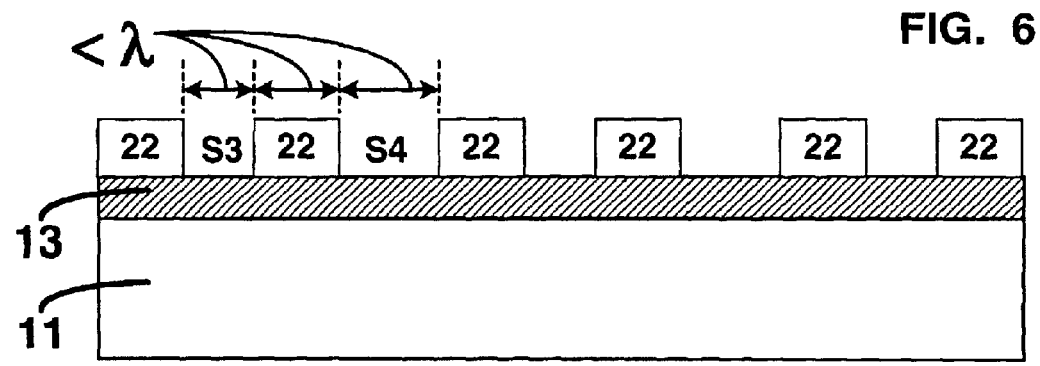

Conversely, a plasma etch process that is selective to oxidized polysilicon (i.e. the etchant removes the polysilicon) can be used to selectively remove the polysilicon line features (21, 25) as depicted in FIG. 7, wherein after the selective etch, the oxidized polysilicon line features 22 remain on the base layer 13. As a result, a sub-lithographic line and space pattern with the oxidized polysilicon line features 22 that have the sub-lithographic size that is less than λ and spaces (S3, S4) that also have the sub-lithographic size that is less than λ are defined on the base layer 13. The spaces (S3, S4) are created when the polysilicon line features (21, 25) are removed by the etching process.

As mentioned previously, one possible use for sub-lithographic line and space patterns of FIGS. 6 and 7 are as an imprinting stamp for nano-imprint lithography. The size of the sub-lithographic line and space patterns as described herein relative to the lithography limit λ will be application dependent and determined in part by the lithography system used for patterning and a wavelength of light of a light source carried by the lithography system, just to name a few. However, based on current state of the art deep UV photo-lithography systems, the lithography limit λ is greater than or equal to about 100.0 nanometers (i.e. λ≧100.0 nm).

The actual value for λ is not to be construed as being limited to any values set forth herein and as was stated above the actual value of λ can vary. As the state of the art in lithography systems advances, the actual value of λ may also decrease.

Referring again to FIGS. 2 and 3a, in one embodiment of the present invention, the steps of removing the photoresist layer 23 and the oxidizing the polysilicon line features 21 can occur as part of a simultaneous process (i.e. the ashing and the oxidation occur at substantially the same time) that includes ashing the photoresist layer 23 in a plasma comprising an oxygen gas ($O_2$) to remove the photoresist layer 23 and simultaneously oxidizing the polysilicon line features 21 in that same plasma. As was described above, the oxidation is continued until the polysilicon line features 21 are reduced to the sub-lithographic feature size and the oxidized mantel 22 of the polysilicon line features 21 has expanded to reduce the space features 20 to the sub-lithographic feature size.

It may be desirable to further decrease the sub-lithographic feature size of the line and space patterns and/or increase a density of the sub-lithographic feature size of the line and space patterns within a given linear distance (i.e the number of line and space patterns per unit of distance is increased).

Figure 8:
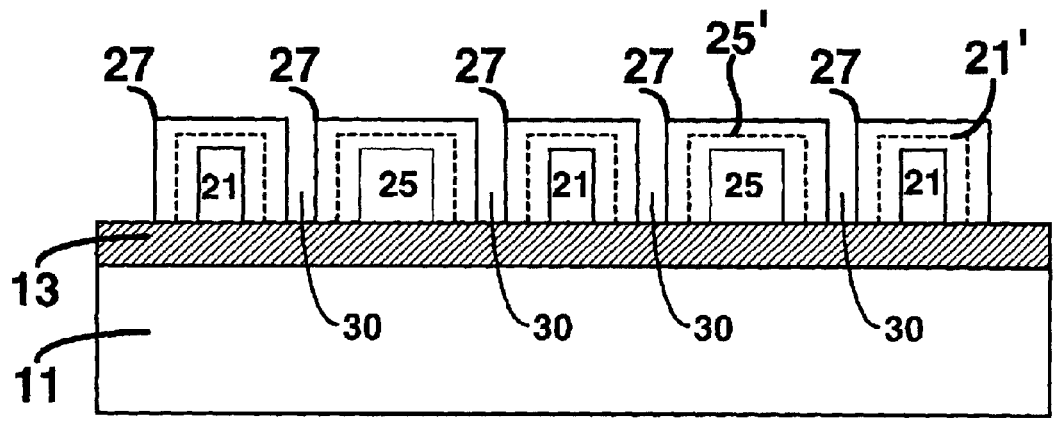
FIG. 8 is a cross-sectional view depicting formation of sub-lithographic line and space features by polysilicon oxidation according to the present invention.

In another embodiment of the present invention, as depicted in FIGS. 6 and 8, after selectively etching the planar layer as was described above in FIG. 6 to selectively remove the oxidized polysilicon line features 22, the remaining polysilicon line features (21, 25) are oxidized in the plasma comprising the oxygen gas ($O_2$) as was described above in reference to FIGS. 3a, 3b, and 3c. In FIG. 8, the oxidation continues until the polysilicon line features (21, 25) are reduced (see reference numeral G2 in FIGS. 3a and 3b) to the sub-lithographic feature size that is less than λ (i.e. <λ) and an oxidized mantel 27 of the polysilicon line features (21, 25) has expanded (see reference numeral G1 FIGS. 3a and 3b) thereby reducing space features 30 to the sub-lithographic feature size because as the oxidized mantel 27 expands the space features 30 are reduced in width as was described above.

Figure 9:
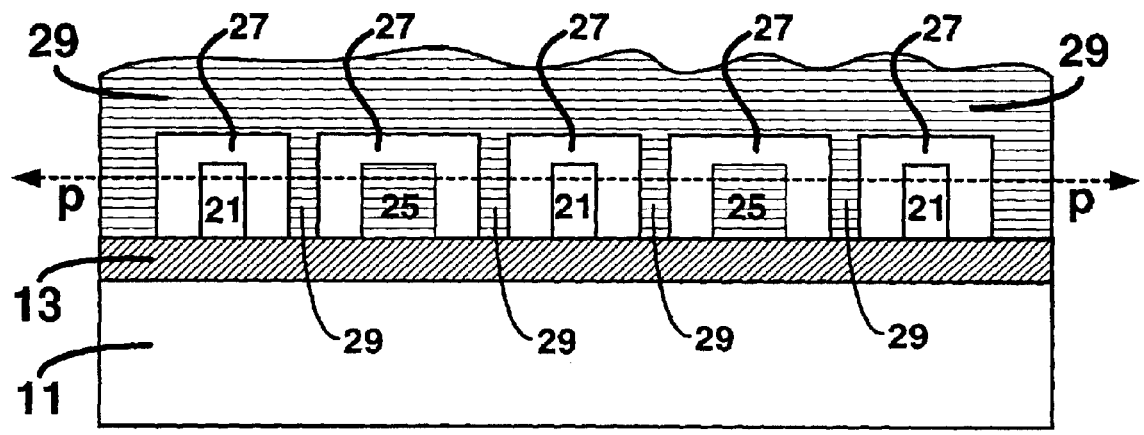
FIG. 9 is a cross-sectional view depicting a deposition of a polysilicon layer over the sub-lithographic line and space features of FIG. 8.

In FIG. 9, in a manner similar to that described above in reference to FIG. 4, a third layer of polysilicon 29 that completely covers the oxidized mantel 27 of the polysilicon line features (21, 25) and completely fills in the space features 30 is deposited. A process including but not limited to PECVD, CVD, and LPCVD can be used to deposit the third layer of polysilicon 29.

Figure 10:
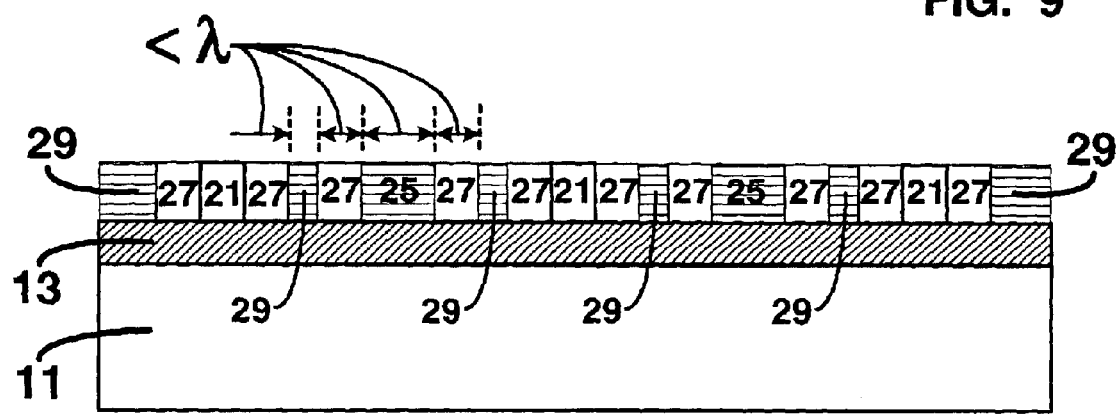
FIG. 10 is a cross-sectional view depicting a planarization process according to the present invention.

In FIG. 10, the third polysilicon layer 29 is planarized to form a planar layer of alternating and sub-lithographic sized polysilicon line features (21, 25, 29) and oxidized polysilicon line features 27. The third polysilicon layer 29 is planarized along a predetermined plane (see dashed line and reference numeral p in FIG. 9). As before, a process such as CMP can be used to planarize the planar layer.

Figure 11:
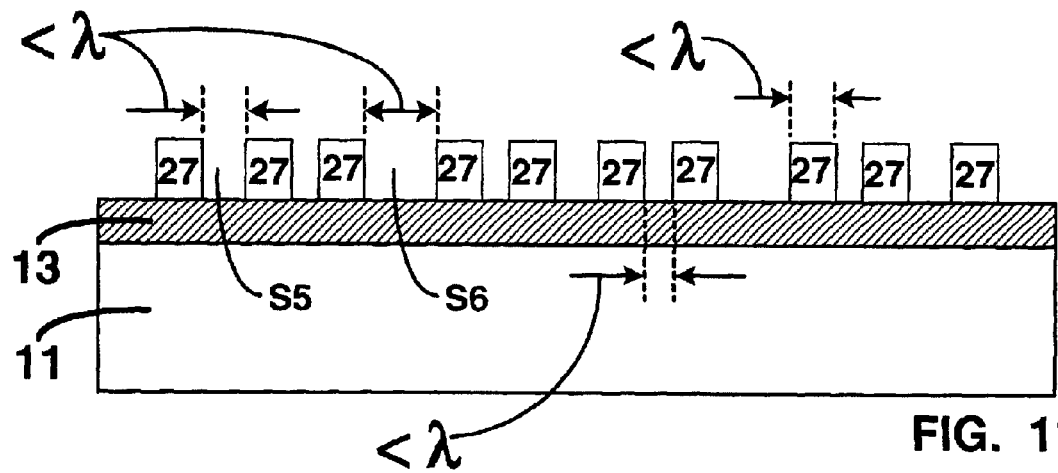
FIGS. 11 and 12 are cross-sectional views depicting a selective etching process according to the present invention.
Figure 12:
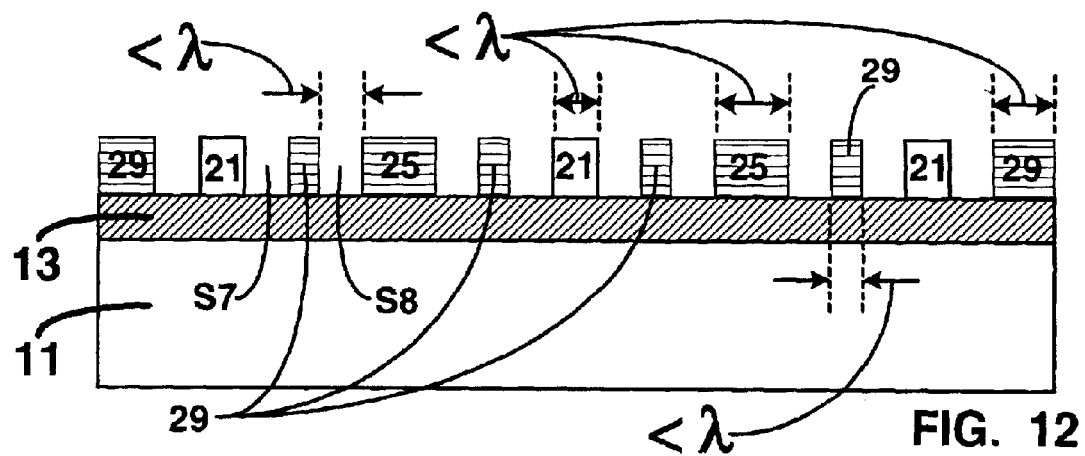

In FIGS. 11 and 12, the planar layer is selectively etched to remove either the polysilicon line features (21, 25, 29) or the oxidized polysilicon line features 27. An etching process including but not limited to a wet etch process and a plasma etching process can be used to selectively etch the polysilicon line features (21, 25, 29) or the oxidized polysilicon line features 27. Preferably, a wet etch process is used to etch the oxidized polysilicon line features 27 and a wet etch or plasma etch process is used to etch the polysilicon line features (21, 25, 29). More preferably, the plasma etch process for the polysilicon line features (21, 25, 29) should be a process other than a reactive ion etching (RIE) process.

For example, a wet etch process that is selective to polysilicon (i.e. the etchant removes the oxidized polysilicon) can be used to selectively remove the oxidized polysilicon line features 27 as depicted in FIG. 12, wherein after the selective etch, the polysilicon line features (21, 25, 29) remain on the base layer 13. As a result, a sub-lithographic line and space pattern with the polysilicon line features (21, 25, 29) that have the sub-lithographic size that is less than $\lambda$ and spaces (S7, S8) that also have the sub-lithographic size that is less than $\lambda$ are defined on the base layer 13. The spaces (S7, S8) are created when the oxidized polysilicon line features 27 are removed by the etching process.

Conversely, a plasma etch process that is selective to oxidized polysilicon (i.e. the etchant removes the polysilicon) can be used to selectively remove the polysilicon line features (21, 25, 29) as depicted in FIG. 11, wherein after the selective etch, the oxidized polysilicon line features 27 remain on the base layer 13. As a result, a sub-lithographic line and space pattern with the oxidized polysilicon line features 27 that have the sub-lithographic size that is less than $\lambda$ and spaces (S5, S6) that also have the sub-lithographic size that is less than $\lambda$ are defined on the base layer 13. The spaces (S5, S6) are created when the polysilicon line features (21, 25, 29) are removed by the etching process.

The processes as described herein in reference to FIGS. 8 through 12 can be repeated as necessary to further reduce the sub-lithographic feature size of the line and space patterns and/or to increase the density (i.e. the number of line and space patterns per unit of length) of those line and space patterns.

Although several embodiments of the present invention have been disclosed and illustrated, the invention is not limited to the specific forms or arrangements of parts so described and illustrated. The invention is only limited by the claims.

What is claimed is:

1. A method of fabricating sub-lithographic sized line and space patterns, comprising:

depositing a first polysilicon layer on a surface of a base layer;

depositing a photoresist layer on a surface of the first polysilicon layer;

patterning and then etching the photoresist layer to define a line and space pattern therein;

transferring the line and space pattern to the first polysilicon layer by etching the first polysilicon layer to define a plurality of polysilicon line features including an initial dimension and a plurality of space features including an initial width, the initial dimension and the initial width including a minimum feature size that is greater than or equal to a lithography limit of a lithographic system used for the patterning;

removing the photoresist layer from the polysilicon line features;

oxidizing the polysilicon line features in a plasma comprising an oxygen gas, and continuing the oxidizing until the polysilicon line features are reduced to a final dimension and an oxidized mantel of the polysilicon line features has expanded and reduced the space features to a final width, the final dimension and the final width including a sub-lithographic feature size that is less than the lithography limit;

depositing a second polysilicon layer that completely covers the oxidized mantel of the polysilicon line features and completely fills in the space features;

planarizing the second polysilicon layer to form a planar layer of alternating and sub-lithographic sized polysilicon and oxidized polysilicon line features; and etching the planar layer to selectively remove a selected one of the polysilicon line features or the oxidized polysilicon line features.

2. The method as set forth in claim 1, wherein etching the planar layer comprises a process selected from the group consisting of a wet etch process, and a plasma etching process.

3. The method as set forth in claim 1, wherein removing the photoresist layer comprises a process selected from the group consisting of a wet etch process, a wet cleaning process using an organic solvent, and an ashing process in a plasma comprising an oxygen gas.

4. The method as set forth in claim 1, wherein both the removing the photoresist step and the oxidizing the polysilicon line features step occur as part of a simultaneous process comprising:

ashing the photoresist layer in a plasma comprising an oxygen gas to remove the photoresist layer while simultaneously oxidizing the polysilicon line features in the plasma comprising the oxygen gas, and continuing the oxidizing until the polysilicon line features are reduced to a sub-lithographic feature size and an oxidized mantel of the polysilicon line features has expanded thereby reducing the space features to the sub-lithographic feature size.

5. The method as set forth in claim 1, wherein the base layer comprises a dielectric material.

6. The method as set forth in claim 1, wherein the base layer is connected with a substrate.

7. The method as set forth in claim 6, wherein the substrate is a material selected from the group consisting of a semiconductor substrate and a silicon substrate.

8. The method as set forth in claim 1, wherein the lithography limit is greater than or equal to about 100.0 nanometers.

9. The method as set forth in claim 1, wherein the planarization step comprises chemical mechanical polishing.

10. The method as set forth in claim 1, wherein the etching the planar layer step comprises selectively removing the oxidized polysilicon features, and further comprising:

oxidizing the polysilicon line features in a plasma comprising an oxygen gas, and continuing the oxidizing until the sub-lithographic feature size of the polysilicon line features are further reduced and an oxidized mantel of the polysilicon line features has expanded thereby further reducing the sub-lithographic feature size of the space features;

depositing a third polysilicon layer that completely covers the oxidized mantel of the polysilicon line features and completely fills in the space features;

planarizing the third polysilicon layer to form a planar layer of alternating and sub-lithographic sized polysilicon line features and oxidized polysilicon line features; and etching the planar layer to selectively remove a selected one of the polysilicon line features or the oxidized polysilicon line features.

11. The method as set forth in claim 10, wherein etching the planar layer comprises a process selected from the group consisting of a wet etch process, and a plasma etching process.

12. The method as set forth in claim 10, wherein the lithography limit is greater than or equal to about 100.0 nanometers.

13. The method as set forth in claim 10, wherein the planarization step comprises chemical mechanical polishing.

* * * * *